United States Patent
Kim

(10) Patent No.: US 7,369,407 B2
(45) Date of Patent: May 6, 2008

(54) FLAT DISPLAY DEVICE AND COOLING APPARATUS FOR THE SAME

(75) Inventor: Hong Ki Kim, Daegu (KR)

(73) Assignee: LG Electronics Inc., Seoul (KR)

( * ) Notice: Subject to any disclaimer, the term of this patent is extended or adjusted under 35 U.S.C. 154(b) by 8 days.

(21) Appl. No.: 11/500,481

(22) Filed: Aug. 8, 2006

(65) Prior Publication Data

US 2007/0103865 A1 May 10, 2007

(30) Foreign Application Priority Data

Nov. 4, 2005 (KR) .................... 10-2005-0105177

(51) Int. Cl.
*H05K 7/20* (2006.01)
*F04D 5/00* (2006.01)
*H04N 5/74* (2006.01)

(52) U.S. Cl. ................ 361/695; 361/694; 454/184; 348/748; 345/60; 345/905; 415/53.1

(58) Field of Classification Search ........ 361/694–695; 165/80.3, 104.33, 121–122; 415/53.1–53.3, 415/212.1; 345/60, 905; 348/748; 313/46; 349/161

See application file for complete search history.

(56) References Cited

U.S. PATENT DOCUMENTS

| | | | | |
|---|---|---|---|---|
| 4,898,003 A | * | 2/1990 | Ichikawa et al. | ............. 62/244 |
| 4,951,737 A | * | 8/1990 | Tenhundfeld et al. | ......... 165/58 |
| 5,127,238 A | * | 7/1992 | Ichikawa et al. | ............. 62/244 |
| 5,335,721 A | * | 8/1994 | Wollaber et al. | ............ 165/122 |
| 5,869,919 A | * | 2/1999 | Sato et al. | ..................... 313/17 |
| 6,493,440 B2 | * | 12/2002 | Gromatzky et al. | ........ 379/161 |
| 6,697,250 B2 | * | 2/2004 | Kuo | ........................... 361/681 |
| 2004/0223299 A1 | * | 11/2004 | Ghosh | ........................ 361/687 |
| 2005/0105012 A1 | * | 5/2005 | Kim et al. | .................... 349/58 |
| 2006/0082271 A1 | * | 4/2006 | Lee et al. | ...................... 313/35 |
| 2006/0164804 A1 | * | 7/2006 | Kim et al. | .................. 361/688 |
| 2006/0199514 A1 | * | 9/2006 | Kimura | ...................... 454/237 |
| 2007/0103863 A1 | * | 5/2007 | Kim | .......................... 361/687 |
| 2007/0103864 A1 | * | 5/2007 | Kim | .......................... 361/687 |
| 2007/0103866 A1 | * | 5/2007 | Park | .......................... 361/695 |
| 2007/0103909 A1 | * | 5/2007 | Park | .......................... 362/294 |

FOREIGN PATENT DOCUMENTS

JP 10117079 A * 5/1998
JP 2003029648 A * 1/2003

* cited by examiner

*Primary Examiner*—Jayprakash Gandhi
*Assistant Examiner*—Robert J Hoffberg
(74) *Attorney, Agent, or Firm*—Ked & Associates, LLP

(57) ABSTRACT

A flat display device includes a flat display module, a front cover supporting a front portion of the flat display module, a back cover supporting a rear portion of the flat display module, a peripheral portion formed on the back cover and having an inclined surface inclined toward a center of the flat display module as it goes rearward, and a cross-flow fan disposed in the back cover and aligned with the inclined surface of the peripheral portion of the back cover. The cross-flow fan has an air exhaust channel having an air outlet inclined toward the center of the flat display module as it goes rearward.

12 Claims, 4 Drawing Sheets

FLAT DISPLAY DEVICE AND COOLING APPARATUS FOR THE SAME

BACKGROUND OF THE INVENTION

1. Field of the Invention

The present invention relates to a flat display device, and more particularly, a cooling apparatus for a flat display device, which can be operated with a low noise while quickly dissipating a larger amount of internal heat to an external side by improving an installation structure of a fan.

2. Description of the Related Art

Unlike a cathode ray tube (CRT), a flat display uses a driving circuit arranged in a matrix pattern to differently excite pixels and thus realize an image. Recently, the flat display device has been widely used as it has advantageous in that it takes up a relatively small space. A variety of flat display modules such as a liquid crystal display (LCD), a field emission display (FED), a plasma display panel (PDP), and an electro-luminescence (EL) have been applied to the flat display device.

The flat display device using the flat display module is reduced in a thickness as compared with the CRT. However, since a large number of heat-generating components must be incorporated in a narrow space of the display device, the heat, which is generated by the heat-generating components in the flat display device during the operation of the flat display module, must be effectively dissipated to an external side.

Particularly, in the case of the PDP, since the image is realized by electric discharge of discharge gas, high temperature heat is generated. Therefore, if the high temperature heat is not quickly dissipated, the display device may malfunction. Needless to say, in the case of other types of flat display devices, the heat dissipation performance is very important fact determining the quality thereof.

In order to locally dissipate the heat, a heat sink is attached on a rear surface of a specific component generating a large amount of heat to cool the specific component. Furthermore, in order to generally dissipate the heat, a plurality of holes are formed on a cover of the flat display device so that cool air can pass through the holes. However, although the cooling effect for the specific component can be expected, the heat is not effectively dissipated to the external side. Therefore, the flat display device cannot be stably operated. That is, the internal temperature of the flat display device increases to deteriorate the performance of the flat display device.

In order to solve the above problem, an axial fan is installed on a rear center of a back cover in a direction perpendicular to a direction where the display device is formed. The axial fan forcedly exhausts the internal high temperature air of the flat display device to the external side through a rear side of the display device. In this case, although the heat collected in the display device can be effectively discharged to the external side, excessive noise is generated during the operation of the axial fan. Furthermore, a gap of ten or more centimeters must be provided between the rear surface of the display device and the wall so that the air can be exhausted. In addition, due to a gap between the axial fan and the flat display module and a thickness of the axial fan, an overall thickness of the flat display device increases.

Furthermore, a plurality of holes through which the air is exhausted and introduced are formed on the back cover. The holes of the back cover deteriorate strength of the back cover. Therefore, the back cover must be enough thick. In this case, the manufacturing cost increases.

SUMMARY OF THE INVENTION

Accordingly, the present invention is directed to a cooling apparatus for a flat display device that substantially obviates one or more problems due to limitations and disadvantages of the related art.

An object of the present invention is to provide a cooling apparatus for a flat display device, which is designed to make the flat display device slimmer and effectively dissipate internal heat of the flat display device.

Another object of the present invention is to provide a cooling apparatus for a flat display device, which can minimize noise and be manufactured with low costs.

Still another object of the present invention is to provide a cooling apparatus for a flat display device, which can minimize noise and improve heat dissipation efficiency by allowing internal air of the flat display device to be exhausted by natural convection.

Still yet another object of the present invention is to provide a cooling apparatus for a flat display device, which can improve an operation reliability of the flat display device by stably supporting a cooling fan.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a flat display device, including: a flat display module; a front cover supporting a front portion of the flat display module; a back cover supporting a rear portion of the flat display module; a peripheral portion formed on the back cover and having an inclined surface inclined toward a center of the flat display module as it goes rearward; and a cross-flow fan disposed in the back cover and aligned with the inclined surface of the peripheral portion of the back cover, wherein the cross-flow fan has an air exhaust channel having an air outlet inclined toward the center of the flat display module as it goes rearward.

In another aspect of the present invention, there is provided a cooling apparatus for a flat display device, including: a flat display module; a cover protecting the flat display module; an air inlet formed on a portion of the cover to allow external air to be introduced; a cross-flow fan disposed inside the cover and aligned with the air outlet, wherein the cross-flow fan includes a motor, an impeller connected to a driving shaft of the motor and a housing for receiving the impeller; the housing includes a stabilizer for stabilizing airflow and a scroll, the impeller being disposed between the stabilizer and the scroll; and an air outlet of the cross-flow fan is formed corresponding to an inner surface of the cover.

In still another aspect of the present invention, there is provided a cooling apparatus for a flat display device, including: a flat display module; a cover protecting the flat display module; an air inlet formed on a portion of the cover to allow external air to be introduced; a cross-flow fan disposed inside the cover and aligned with the air outlet, wherein the cross-flow fan has an air outlet that is inclined toward a center of the flat display module as it goes rearward.

According to the present invention, the heat dissipation efficiency can be improved and the vibration and noise caused by airflow can be reduced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
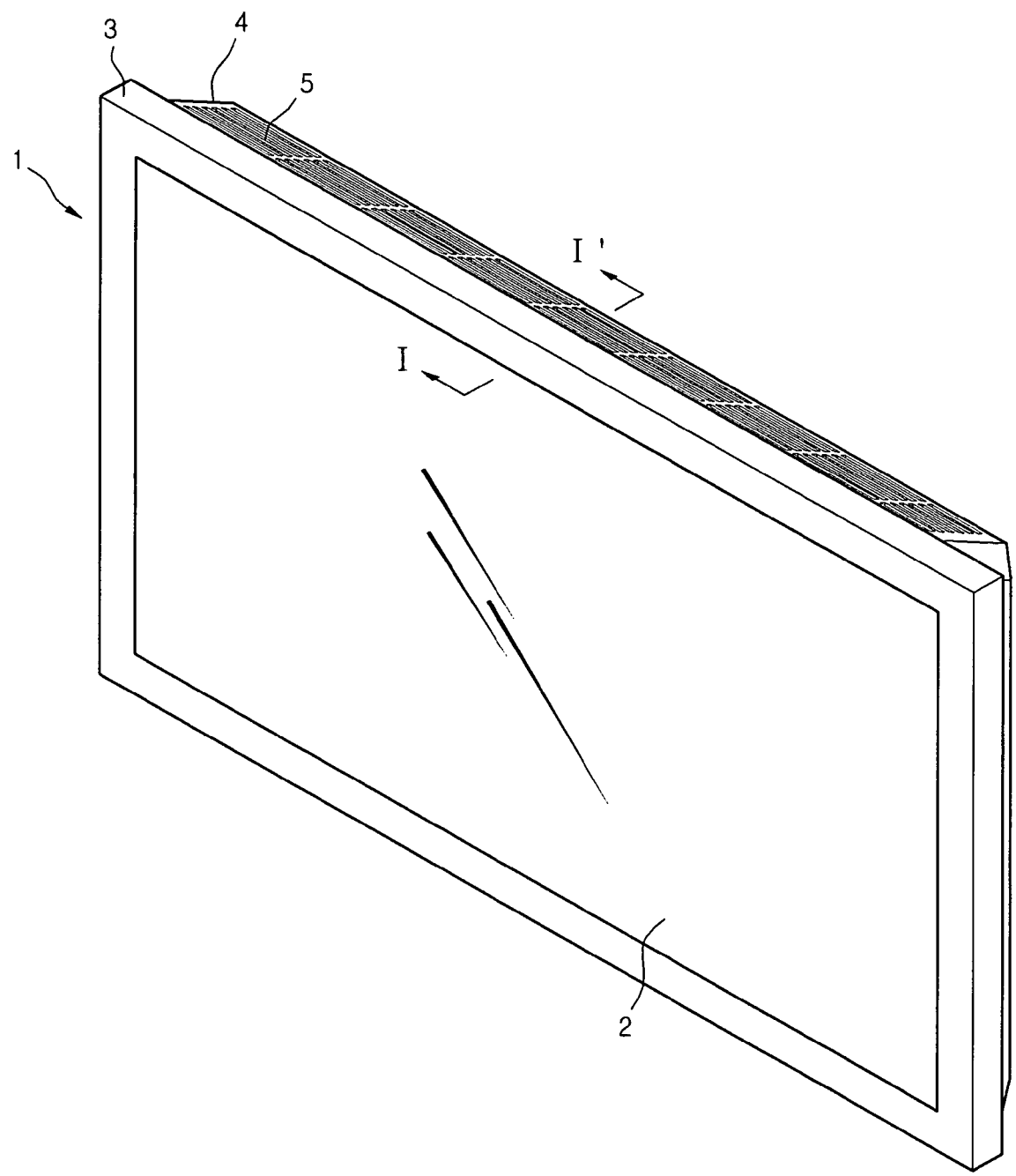
FIG. 1 is a perspective view of a flat display device according to an embodiment of the present invention.

FIG. 1 is a perspective view of a flat display device according to an embodiment of the present invention.

Referring to FIG. 1, a flat display device 1 of this embodiment includes a flat display module 2, a front cover 3 for supporting and protecting a front portion of the flat display module 2, and a back cover 4 for supporting and protecting a rear portion of the flat display module 2. An upper air outlet 5 through which internal hot air of the flat display device 1 exhaust is formed on an upper inclined periphery of the back cover 4.

The flat display module 2 may be selected from the group consisting of an LCD, an FED, a PDP, and an EL. Preferably, the flat display module 2 may be the PDP generating a large amount of heat.

The front and back covers 3 and 4 define a space for receiving the flat display module 2 and protect components disposed in the space. The front and back covers 3 and 4 are independent parts that are assembled with each other. However, the present invention is not limited to this case. For example, the front and rear covers 3 and 4 may be integrated with each other as a single body as far as they can protect the front and rear portions of the display device. There is a predetermined gap between a heat generating component provided on a surface of the flat display module 2 and an inner surface of the back cover 4 so that air flows through the gap to cool the heat generating component and is then exhausted through the upper air outlet 5.

The operation of a cooling apparatus of the present invention will now be described with reference to the above flat display device.

When the flat display device 1 operates, a large amount of heat is generated in the flat display module 2. At this point, the hot air generated from the heat generating component disposed on the rear surface of the flat display module 2 is cooled by the incoming air. Then, the hot air flows upward and is then exhausted through the upper air outlet 5. This is the natural convection for exhausting the hot air out of the flat display device, thereby improving the cooling efficiency. At this point, it is more preferable to allow outer air to be introduced through an overall area of the lower peripheral portion of the flat display device 1 and exhausted via an overall area of the rear portion of the display device 1.

Furthermore, the upper air outlet 5 is provided on an inclined peripheral portion of the back cover so that the hot air can be exhausted upward and thus the hot air can more effectively flow.

In addition, since the front surface of the flat display module 2 is exposed to the external side, the heat generated from the front portion of the display module 2 can be quickly dissipated by the natural convection of the outer air.

Figure 2:
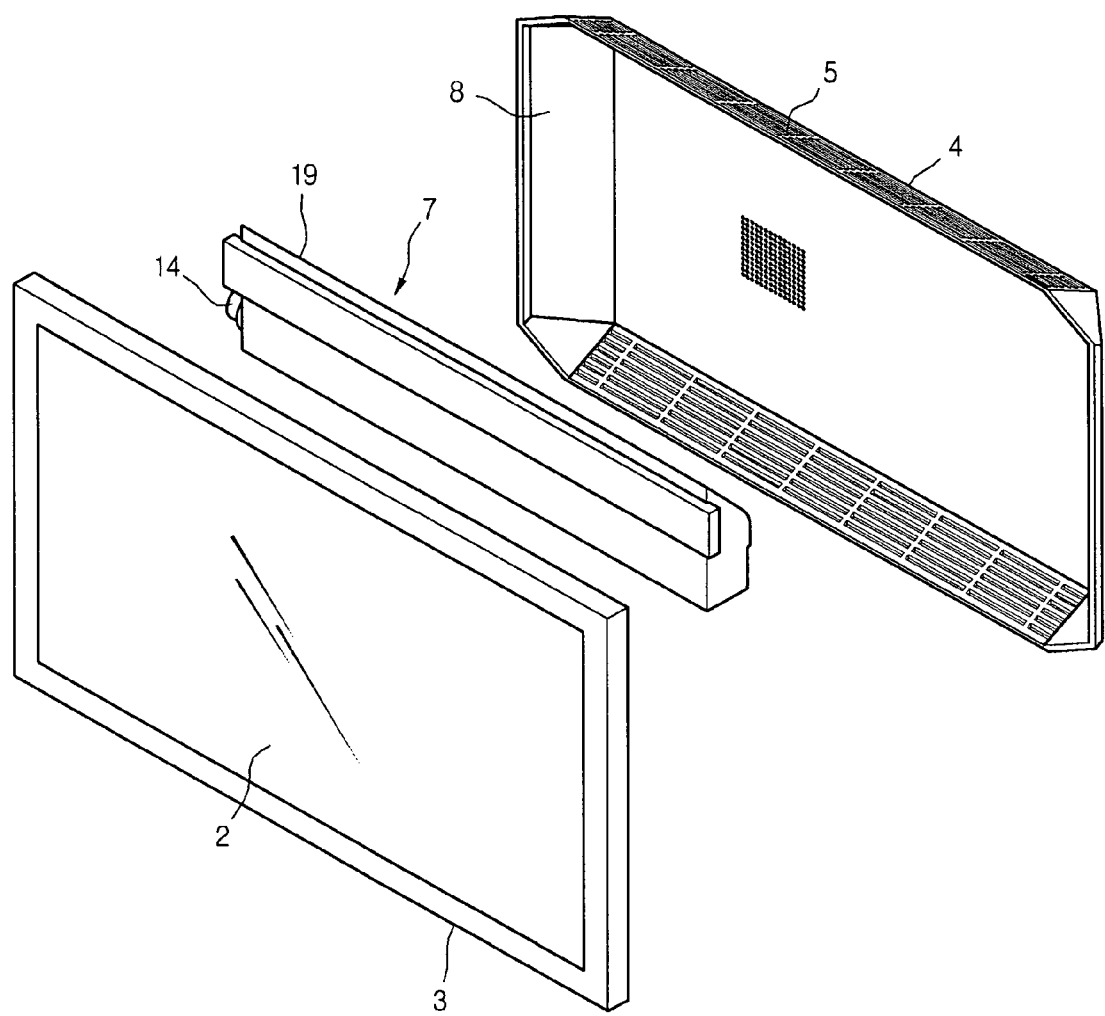
FIG. 2 is an exploded perspective view of the flat display device of FIG. 1.

FIG. 2 is an exploded perspective view of the flat display device, in which the display module 2 and the front cover are in an assembled state.

Referring to FIGS. 1 and 2, the cross-flow fan 7 is disposed between an upper portion of the back cover 4 and an upper portion of the front cover 3. An air outlet channel 20 of the cross-flow fan 7 is aligned with the upper air outlet 5 of the back cover 4. Therefore, when the cross-flow fan operates, the internal hot air of the flat display device can be exhausted to the external side through the upper air outlet 5 of the back cover 4.

The peripheral portion of the back cover 4 is inclined toward a center of the display device as it goes rearward, thereby defining an inclined surface 8. As the peripheral portion of the back cover 4 is inclined, it can be hidden when the flat display device is viewed from a front side, thereby not deteriorating the appearance of the display device. In addition, the inclination of the peripheral portion of the back cover 4 makes the flat display device compact. A plurality of slits is formed on the top inclined surface 8 of the peripheral portion of the back cover 4 to define the air outlet 5.

Figure 3:
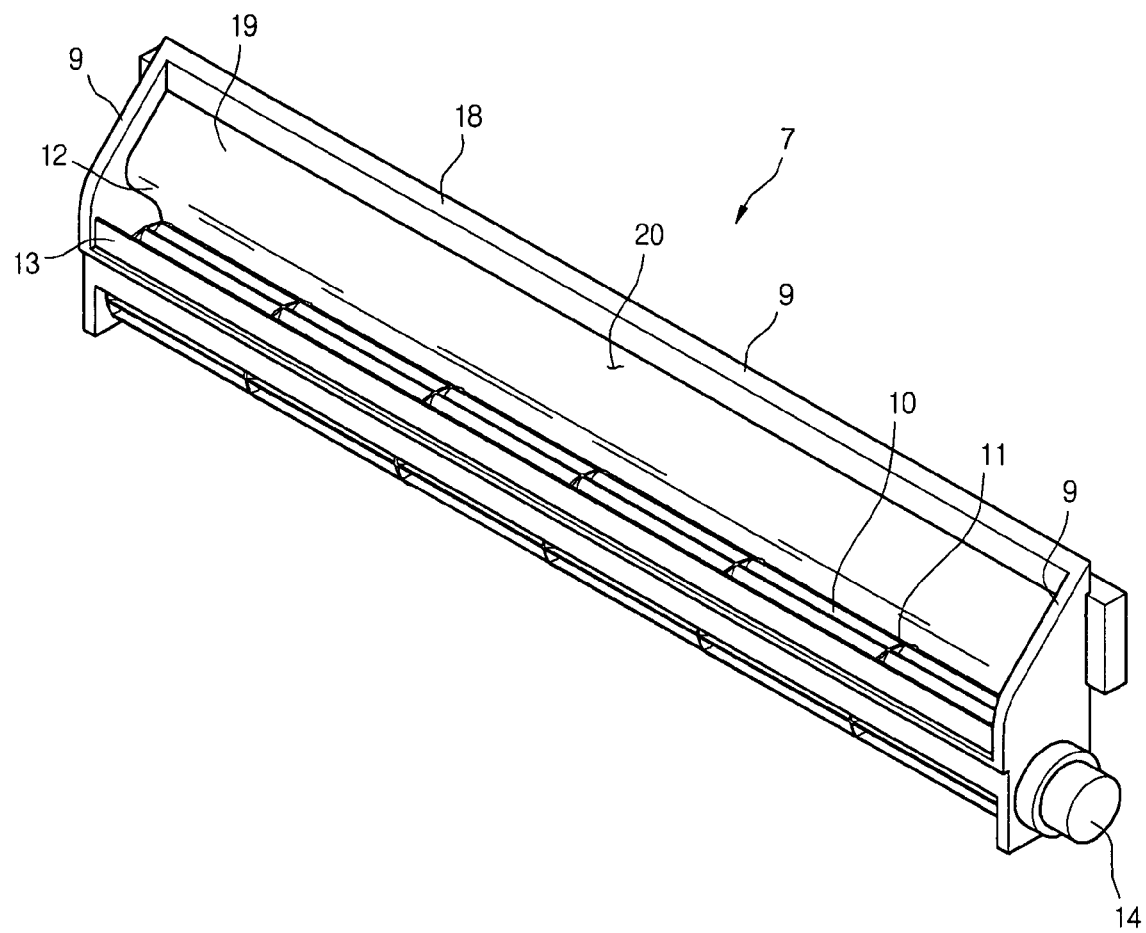
FIG. 3 is a rear perspective view of a cross-flow fan according to an embodiment of the present invention.

FIG. 3 is a rear perspective view of the cross-flow fan.

Referring to FIG. 3, the cross-flow fan 7 includes an impeller 10 disposed in the longitudinal direction of the back cover 4 and a circular plate 11 for dividing the impeller 10 by a predetermined interval along the longitudinal direction of the impeller 10 and enhancing strength of the impeller 10. The cross-flow fan 7 is further includes a driving shaft (not shown) connected to a motor 14. A rotational force of the motor 14 is transferred to the cross-flow fan via the driving shaft.

The impeller 10 is disposed in a housing 18 to guide the airflow when the impeller 10 rotates. The housing 18 includes a scroll 12 disposed in front of the impeller 10 and spaced apart from the impeller 10 and a stabilizer 13 disposed in rear of the impeller 10 and spaced apart from the impeller 10. The impeller 10 rotates clockwise in the drawing.

Describing the housing 18 in more detail, the housing 18 has upper and lower opened ends and defining an air exhaust channel 20, at a lower portion of which the impeller 10 is disposed.

The scroll 12 is provided with a diffuser 19 that is gently curved frontward. The diffuser 19 disperses the air to reduce the airflow resistance and airflow noise.

The top surface 9 of the housing 7 is inclined rearward in response to the inclined surface 8 of the back cover 4. That is, the top surface 9 of the housing 7 defines an upper end of the cross-flow fan 7.

As described above, as the top surface 9 of the housing 18 is generally inclined, it can exactly correspond to the inclined surface 8, thereby the installation space of the cross-flow fan 7 more compact.

In addition, since a cross section of the air exhaust channel 20 is sufficiently wide, the airflow resistance and airflow noise can be reduced. That is, the air exhaust channel 20 defined between the diffuser 19 and the stabilizer 13 exactly corresponds to the air outlet 5 of the back cover 4, the air directed upward by the impeller 10 can be exhausted to the external side in a state where the air is widely dispersed. As a result, the airflow resistance and airflow noise can be reduced. Furthermore, since the top surface 9 of the housing 18 is inclined, the air expelled by the cross-flow fan 7 does not stay in the flat display device, thereby improving the heat dissipation efficiency and obtaining a sufficient installation space for the diffuser 19.

Meanwhile, the top surface 9 of the housing 18 is inclined to generally correspond to the inclined surface 8 of the back cover 4, the airflow resistance and the air leakage generated during the air flows can be more reduced.

Figure 4:
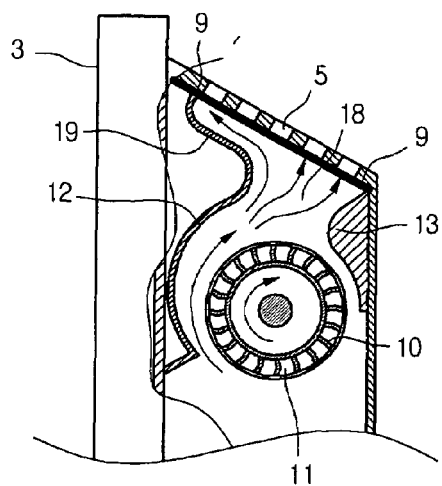
FIG. 4 is a sectional view taken along line I-I' of FIG. 1.

FIG. 4 is a sectional view taken along line I-I' of FIG. 1.

Referring to FIG. 4, when the cross-flow fan 7 rotates clockwise, the internal hot air of the flat display device flows upward and goes out through the air exhaust channel 20. At this point, since the air exhaust channel 20 is aligned with the air outlet 5 of the back cover 4, the internal hot air can be effectively exhausted out of the flat display device.

Here, as described above, the top surface 9 of the housing 18 exactly corresponds to the inclined surface 8 of the back cover 4. That is, a height of the stabilizer 13 is lower than that of the scroll 12 such that the top surface 9 is inclined as it goes rearward. Thus, a height of the air outlet channel 20 is lowered as it goes rearward.

Therefore, the air coming out through the air outlet channel 20 of the housing 18 is directly exhausted to the external side through the air outlet 5 of the back cover 4, thereby improving the heat dissipation efficiency. That is, the possibility of the back flows of the air that is being exhausted through the air exhaust channel 20 can be reduced. In order to further prevent the air from flowing backward, a sealing member may be interposed between the top surface 9 and the air outlet 5 of the back cover.

Furthermore, since the diffuser 19 extends frontward, the dispersion effect of the air that is being exhausted can be further improved, thereby further reducing the airflow resistance and airflow noise.

In addition, since the cross-flow fan 7 can be stably installed in the back cover 4 without overlapping in the use of the space, the vibration and noise that can be generated during the operation of the cross-flow fan can be reduced. A rear surface of the stabilizer 13 is designed to exactly correspond to the inner surface of the back cover 4, the installation convenience of the cross-flow fan 7 can be improved and the vibration/noise can be further reduced.

Figure 5:
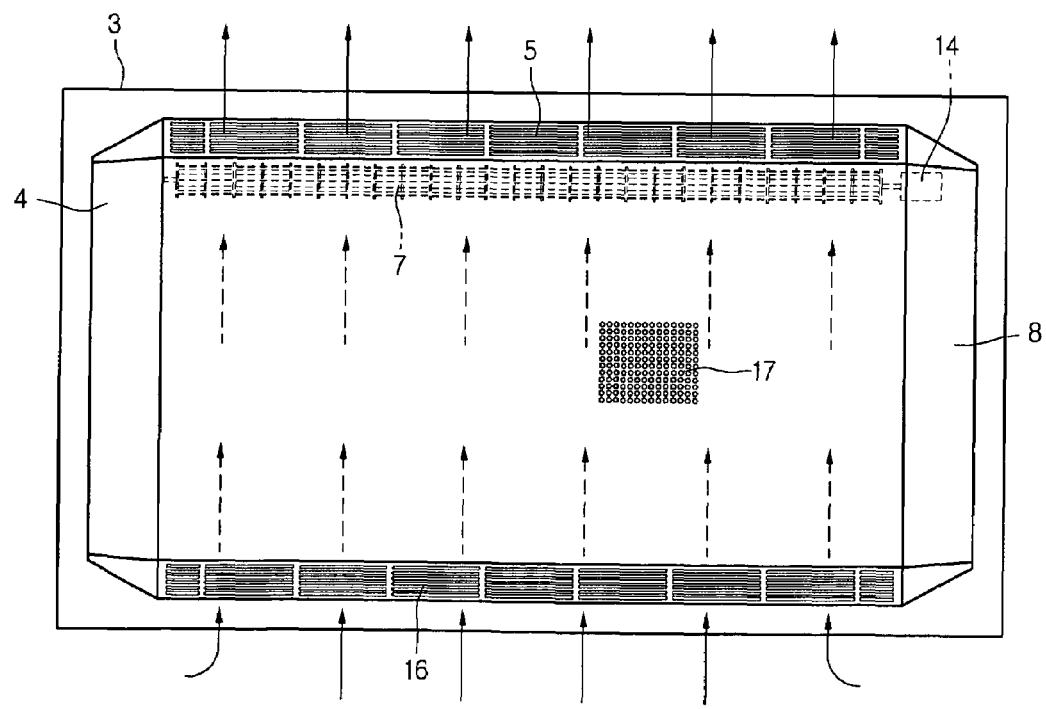
FIG. 5 is a rear view of the flat display device of FIG. 1.

FIG. 5 is a rear view of the flat display device of FIG. 1.

Referring to FIG. 5, the back cover 4 is further provided with a lower air inlet 16 and a rear air inlet 17.

The lower air inlet 16 is formed on an inclined portion of the lower periphery of the back cover 4 to introduce external cool air into the flat display device. The cool air introduced through the lower air inlet compensates for the hot air exhausted through the upper air outlet 5. That is, the cool air introduced compensates for a negative pressure generated by the natural convection and a negative pressure generated by the air exhausted through the upper air outlet 5.

The cool air introduced through the lower air inlet 16 cools the components provided on the rear surface of the flat display module 2 and is then exhausted through the upper air outlet 5 via the cross-flow fan 7.

The lower air inlet 16 is preferably formed along the overall longitudinal length of the lower periphery of the back cover 4 so that the components can be uniformly cooled. Arrows in the drawing indicates the airflow direction.

The cross-flow fan 7 is formed along the overall longitudinal length of the top surface of the back cover 4 and the effective exhaust area of the air outlet channel 20 of the cross-flow fan is formed throughout the overall area of the top surface of the back cover 4. Therefore, the cool air introduced through the lower air inlet 16 flows upward, in the course of which the components is cooled, and is then exhausted through the upper air outlet. If the length of the cross-flow fan 7 is reduced, the heat dissipation effect at the both inner sides of the flat display device may be reduced. Nevertheless, since the effective exhaust area is large enough, the heat dissipation efficiency can be still improved.

Some of the components (i.e., a power unit) generate high temperature heat and some of the components (i.e., tape carrier package chip (TCP)) require a low temperature condition.

In order to meet the operational condition for each component, it is preferable that the components that require the thermal stability are disposed close to the lower air inlet 16 so that they can be quickly cooled by the cool air introduced. In addition, the components generating a large amount of heat is preferably disposed close to the cross-flow fan 7 so that the heat generated by the components can be quickly dissipated without affecting on other circuits.

The rear air inlet 17 is provided for the components that cannot be changed their installing location. The is, the rear air inlet 17 is formed on a portion of the back cover 4 corresponding to a specific portion of the flat display module 2 where the heat generation components are disposed. Therefore, the heat generation components disposed corresponding to the rear air inlet 17 can be quickly cooled by the cool air introduced through the rear air inlet 17. If the installing location of the heat generation components can be changed, the rear air intake opening components may be omitted. That is, the heat generation components may be adjusted in their installing location to be closer to the cross-flow fan 7 or the lower air inlet 16.

As described above, since the cross-flow fan contacts the inner surface of the back cover 4 with a housing 18 having an inventive inclined portion, the internal hot air of the back cover can be quickly exhausted without back flows, thereby improving the heat dissipation efficiency and operational reliability of the flat display device.

Alternatively, the peripheral portion of the back cover may not be inclined. In this case, the outlet of the air exhaust channel must contact the inner surface of the peripheral portion of the back cover so that the air exhausted through the air exhaust channel can be directly exhausted to the external side of the display device and the space for installing the cross-flow fan can be reduced. Therefore, when the peripheral portion of the back cover is horizontally formed without being inclined, the outlet of the air exhaust channel must be horizontal in response to the horizontal peripheral portion so that it can contact the horizontal peripheral portion.

In addition, when the peripheral portion of the back cover is formed to be inclined, the inclination must be variously set. For example, the inclination at the corner of the back cover may be higher than at the center of the back cover. In this case, the outlet of the air exhaust channel of the cross-flow fan and is formed corresponding to the inclination of the peripheral portion of the back cover. That is, the inclination at the corners of the outlet of the air outlet channel of the cross-flow fan is higher than that at the center portion of the outlet of the air outlet channel.

According to the present invention, since no space for installing the blower fan is required, the flat display device can be designed to be slimmer while providing a sufficient heat dissipation effect.

Furthermore, since the air exhaust outlet is formed in a shape similar to a cross section of the flat display device, the structure is simplified and the airflow noise can be minimized.

Since the internal hot air of the flat display device can be exhausted by a negative pressure generated by the fan as well as by the natural convection, the air circulation can be effectively realized in the display device.

As the airflow rate in the flat display device increases, there is no need to additionally form holes, which may cause the deterioration of the strength of the back cover, on the rear surface of the back cover. Therefore, there is no need to make the back cover using high strength steel plate that is expensive, thereby reducing the manufacturing costs.

Furthermore, by properly adjusting the installation location of the fan, the structure can be simplified and the size of the flat display device can be further reduced.

Since the fan is stably installed on an accurate position, the operational reliability of the fan can be improved.

Since the backflow of the air that is being exhausted can be prevented, the heat dissipation efficiency can be further improved.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A flat display device, comprising:
   a flat display module;
   a front cover supporting a front portion of the flat display module;
   a back cover supporting a rear portion of the flat display module;
   a peripheral portion formed on the back cover and having an inclined surface inclined toward a center of the flat display module as it goes rearward; and
   a cross-flow fan disposed in the back cover and aligned with the inclined surface of the back cover,
   wherein the cross-flow fan has an air outlet channel inclined toward the center of the flat display module as it goes rearward.

2. The flat display device according to claim 1, wherein the inclined surface is formed on an upper peripheral portion of the back cover.

3. The flat display device according to claim 1, wherein an air inlet through which external air is introduced into the flat display device is formed on a lower peripheral portion of the back cover.

4. The flat display device according to claim 1, wherein the cross-flow fan is formed along a longitudinal length of the back cover.

5. The flat display device according to claim 1, wherein the air outlet channel contacts an inner surface of the inclined peripheral portion of the back cover.

6. The flat display device according to claim 5, wherein the air outlet channel fully contacts an inner surface of the inclined peripheral portion of the back cover.

7. The flat display device according to claim 1, wherein the inclined surface is uniformly inclined.

8. A cooling apparatus for a flat display device, comprising:
   a flat display module;
   a cover protecting the flat display module;
   an air inlet formed on a portion of the cover to allow external air to be introduced;
   a cross-flow fan disposed inside the cover and discharging the hot air inside of the cover,
   wherein the cross-flow fan has an air outlet channel that is inclined toward a center of the flat display module as it goes rearward and;
   wherein the cross-flow fan is disposed along a longitudinal length inside of the upper portion of the cover.

9. The cooling apparatus according to claim 8, wherein the cross-flow fan is aligned with a peripheral portion of the cover so that internal air can be exhausted through the peripheral portion of the cover.

10. The cooling apparatus according to claim 9, wherein the peripheral portion of the cover is inclined toward a center of the flat display module as it goes rearward.

11. The cooling apparatus according to claim 8, wherein the air inlet is formed on a lower peripheral portion of the cover.

12. The cooling apparatus according to claim 8, wherein the air outlet of the cross-flow fan contacts an inner surface of the cover.

* * * * *